United States Patent
Evans (10) Patent No.: US 8,942,022 B2
(45) Date of Patent: Jan. 27, 2015

(54) EMBEDDED NON-VOLATILE MEMORY CIRCUIT FOR IMPLEMENTING LOGIC FUNCTIONS ACROSS PERIODS OF POWER DISRUPTION

(71) Applicant: Radiant Technologies, Inc., San Ramon, CA (US)

(72) Inventor: Joseph T. Evans, Albuquerque, NM (US)

(73) Assignee: Radiant Technologies, Inc., Albuquerque, NM (US)

( * ) Notice: Subject to any disclaimer, the term of this patent is extended or adjusted under 35 U.S.C. 154(b) by 0 days.

(21) Appl. No.: 14/338,153

(22) Filed: Jul. 22, 2014

(65) Prior Publication Data

US 2014/0334220 A1 Nov. 13, 2014

Related U.S. Application Data (60) Division of application No. 13/543,652, filed on Jul. 6, 2012, now Pat. No. 8,824,186, which is a continuation-in-part of application No. 12/797,539, filed on Jun. 9, 2010, now Pat. No. 8,310,856, and a continuation-in-part of application No. 13/223,815, filed on Sep. 1, 2011, now Pat. No. 8,565,000, which is a continuation of application No. PCT/US2010/038433, filed on Jun. 11, 2010.

(51) Int. Cl.
*G11C 11/22* (2006.01)

(52) U.S. Cl.
CPC .......... *G11C 11/2297* (2013.01); *G11C 11/221* (2013.01)

USPC .................. 365/145; 365/148; 365/163

(58) Field of Classification Search
CPC ..................................................... G11C 11/22
USPC ......... 365/49.13, 65, 109, 117, 145; 257/295, 257/E21.208, E21.663, E21.664, E27.104, 257/E29.164; 438/3
See application file for complete search history.

(56) References Cited

U.S. PATENT DOCUMENTS

| | | | |
|---|---|---|---|
| 2004/0061153 A1* | 4/2004 | Misewich et al. | 257/295 |
| 2004/0108526 A1* | 6/2004 | Takahashi et al. | 257/204 |
| 2007/0014169 A1* | 1/2007 | Takahashi et al. | 365/203 |
| 2008/0068877 A1* | 3/2008 | Takahashi et al. | 365/156 |
| 2009/0207642 A1* | 8/2009 | Shimano et al. | 365/72 |

* cited by examiner

*Primary Examiner* — Harry W Byrne
(74) *Attorney, Agent, or Firm* — Calvin B. Ward (57) ABSTRACT

A circuit having an autonomous ferroelectric memory latch (AML) is disclosed. An AML characterized by an AML input, an AML output, a first AML power contact, a second AML power contact and an AML state, and a first switch in series with one of the AML input or the AML output. The switch is positioned to prevent the state of the AML from changing when power is provided between the first and second AML power contacts. In one aspect of the invention, the circuit could include a second switch in series with the other of the AML input or the AML output and a latch in series with the AML input or the AML output. The latch is positioned such that a direct path back does not exist between the AML output and the AML input.

6 Claims, 13 Drawing Sheets

EMBEDDED NON-VOLATILE MEMORY CIRCUIT FOR IMPLEMENTING LOGIC FUNCTIONS ACROSS PERIODS OF POWER DISRUPTION

RELATED APPLICATIONS

This application is a divisional of U.S. patent application Ser. No. 13/543,652, filed on Jul. 6, 2012, which was a continuation in part of U.S. patent application Ser. No. 12/797, 539, filed on Jun. 9, 2010, now U.S. Pat. No. 8,310,856, and a continuation in part of U.S. patent application Ser. No. 13/223,815 filed on Sep. 1, 2011, now U.S. Pat. No. 8,565, 000, and claiming priority from PCT/US10/38433, which claimed priority from U.S. patent application Ser. No. 12/480, 645, filed Jun. 8, 2009, now U.S. Pat. No. 7,990,794.

BACKGROUND

Logic circuits that must operate across power disruptions are known to the art. The simplest form of such circuits utilizes some form of energy storage such as a battery to maintain the state of the system during the period in which the power that normally runs the circuit is off. Such systems are limited by the amount of power that can be stored. Some circuitry prolongs the period over which external power is not needed by entering a low power mode that maintains the state of the circuitry for an extended period of time.

A second class of circuits stores the state of the system in a non-volatile memory prior to powering down in the event of a power disruption. When power is restored, the system state is "reloaded" from the non-volatile memory and system operation continues. This type of system typically requires a separate save/restore mode. In one class of systems, the non-volatile memory that stores the state operates at different logic levels or frequencies than the circuitry whose state is being saved. For example, the non-volatile memory could be an EEPROM that operates as a shadow RAM. The voltages and cycle times needed to store information into the non-volatile memory are substantially different from those used by the logic circuits, and hence, the non-volatile memory cannot track the state of the system in real time such that the state of the system is always stored in the non-volatile memory. In addition, the save cycle requires a separate system mode that adds complexity and cost to the system.

A second class of non-volatile memory is based on ferroelectric memory devices. These devices operate at the same logic levels as the other circuitry, and can be read and written in times comparable to those of the logic circuitry. However, these non-volatile memory devices must be read and written synchronously, and hence, using such non-volatile memory devices for storing and restoring the state of the system still typically involves a separate save/restore procedure. Further, since these memories can be written by voltages that are within the normal logic levels of the associated circuitry, preventing alteration of the data stored therein during periods of power instability such as during power down or power up poses significant challenges.

SUMMARY

The present invention includes a circuit having an AML characterized by an AML input, an AML output, a first AML power contact, a second AML power contact and an AML state, and a first switch in series with the AML input or the AML output. The present invention also includes a method for operating the circuit to preserve the state of the circuit across power disruptions. The switch is positioned to prevent the state of the AML from changing when power is provided between the first and second AML power contacts. In one aspect of the invention, the circuit could include a second switch in series with the other of the AML input or the AML output and a latch in series with the AML input or the AML output. The latch is positioned such that a direct path does not exist between the AML output and the AML input.

The circuit could include a circuit element that performs an operation on the AML output to generate a circuit element output that is coupled to the AML input by the latch.

In one aspect of the invention, the circuit could also include a switch controller that opens the first and second switches prior to power being removed from the first and second AML power contacts. The timing of the opening and closing of the first and second switches is adjusted to allow the circuit to achieve a predetermined state prior to the closing of the other of the first and second switches.

DETAILED DESCRIPTION

The manner in which the present invention provides its advantages can be more easily understood with reference to a novel ferroelectric latch design that is described in U.S. Pat. No. 7,990,749, which is hereby incorporated by reference. For the purposes of this discussion, an AML will be defined to be a latch having an autonomous memory circuit and a feedback loop, wherein the autonomous memory circuit includes a ferroelectric capacitor, a conductive load and a switch having a current actuated control input that connects an output node to a first power rail, the conductive load connecting a second power rail to the output node, the ferroelectric capacitor being connected between the switch control input and the output node.

Figure 1A:
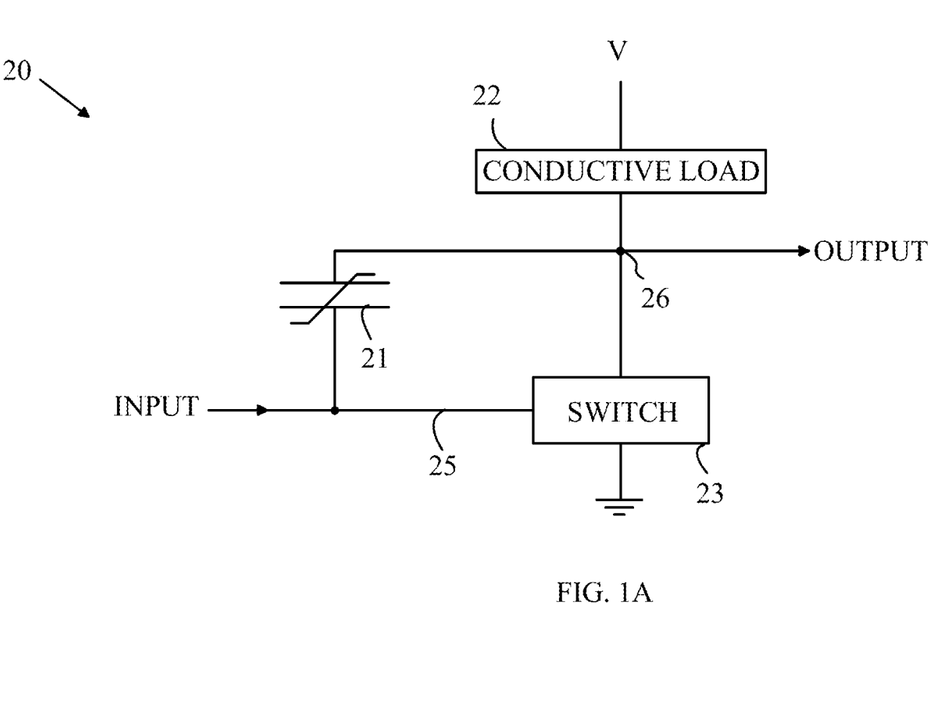
FIG. 1A is a schematic drawing of an autonomous memory circuit.

Refer first to FIG. 1A, which is a schematic drawing of an autonomous memory circuit. Autonomous memory circuit 20 includes a ferroelectric capacitor 21 and a switch 23 having a current actuated control input 25. A conductive load 22 is connected between a power rail and switch 23.

Ferroelectric capacitor 21 has a remanent polarization that can be switched by applying a voltage across ferroelectric capacitor 21. That is, in the absence of a voltage across the capacitor, the dielectric of the capacitor is electrically polarized. For the purpose of this discussion, the dielectric has two states corresponding to the dielectric being polarized either up or down. If a voltage is applied across the ferroelectric capacitor, an electric field is created in the ferroelectric capacitor. If the field direction is the same as that of the remanent polarization, a small current flows in the circuit connecting the two plates of the ferroelectric capacitor. If, on the other hand, the applied electric field is in a direction opposite to that of the remanent polarization, the remanent polarization will change direction to conform to the new field direction, and a large current will flow in the external circuit. The magnitude of the current and the voltage at which it flows can be set by adjusting the composition, area, and thickness of the ferroelectric capacitor.

Switch 23 changes from a high impedance state to a low impedance state when a current enters current actuated control input 25. In autonomous memory circuit 20, it is assumed that the potential of the input line to switch 23 remains at or near ground independent of the state of the switch. To simplify the following discussion, it will be assumed that the power rail is positive and that the "UP" remanent polarization state is set when the positive rail potential, V, is applied across the plates of ferroelectric capacitor 21. However, other embodiments in which the input is referenced to power and the output is referenced to ground can be utilized.

First, assume that ferroelectric capacitor 21 is polarized in the UP state. When power is turned on, switch 23 is initially in the off state; hence, the potential at node 26 will increase to V. Thus, the field applied to ferroelectric capacitor 21 will also be in the UP direction, and ferroelectric capacitor 21 will not flip states. Accordingly, little current will flow into the input of switch 23, switch 23 will remain off, and the output of autonomous memory circuit 20 will quickly go to the potential of V.

Next, assume that ferroelectric capacitor 21 is polarized in the DOWN state. When power is turned on, the applied electric field across ferroelectric capacitor 21 will be opposite to that of the remanent polarization of ferroelectric capacitor 21, and ferroelectric capacitor 21 will flip states to match the applied electric field. In this case, a much larger current will flow into the control input of switch 23, and switch 23 will enter the conducting state. Node 26 will rise to an intermediate state that is less than V. The specific potential will depend on the details of the switch. This intermediate state will remain until ferroelectric capacitor 21 finishes switching to its UP state. At that point there will be no more charge flowing out of ferroelectric capacitor 21, and switch 23 will again enter the non-conducting state. Hence, the potential on node 26 will then increase back to V.

Thus, after power is turned on, autonomous memory circuit 20 will have a temporary output that depends on the state of polarization of ferroelectric capacitor 21 for the period of time needed for ferroelectric capacitor 21 to switch states. If ferroelectric capacitor 21 is UP when power is turned on and does not switch, the output will go high almost immediately. If ferroelectric capacitor 21 is DOWN when power is turned on and does switch, the output will go to the intermediate state characterized by voltage $V_s$ for the temporary period and then will go high. After that temporary time period, the output will always be high, and ferroelectric capacitor 21 will be in the UP polarization state.

Figure 1B:
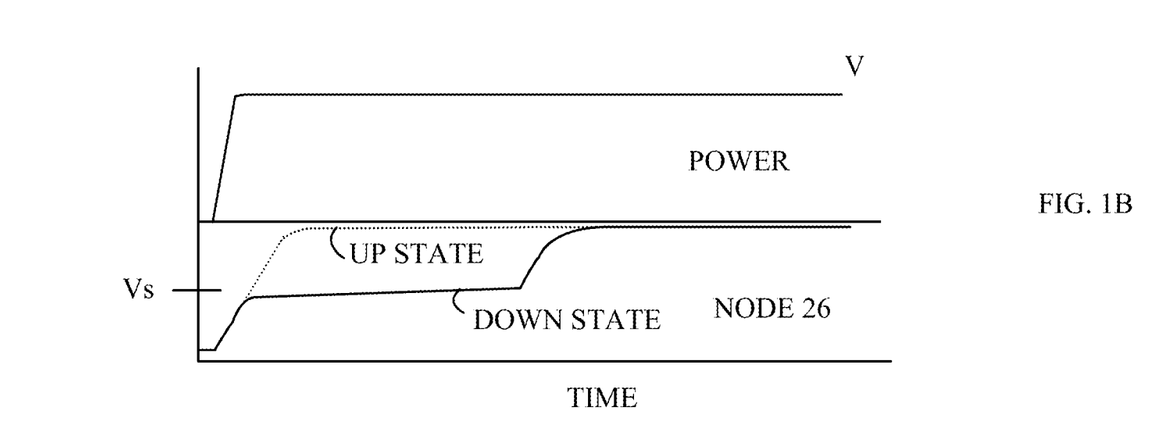
FIG. 1B illustrates the potential on the power rail and on node 26 shown in FIG. 1A as a function of time when autonomous memory circuit 20 is powered up with ferroelectric capacitor 21 in the UP and DOWN states.

Refer now to FIG. 1B, which illustrates the potential on the power rail and on node 26 shown in FIG. 1A as a function of time when autonomous memory circuit 20 is powered up with ferroelectric capacitor 21 in the UP and DOWN states. If ferroelectric capacitor 21 is in the DOWN state when autonomous memory circuit 20 is powered up, the potential on node 26 initially increases with the power rail potential until the potential at node 26 reaches a value that causes ferroelectric capacitor 21 to begin to change polarization state. As ferroelectric capacitor 21 begins to flip polarization, charge is released that causes switch 23 to begin to conduct. If switch 23 begins to conduct too much, the potential on node 26 begins to drop and ferroelectric capacitor 21 stops switching. If switch 23 does not conduct enough, the potential on node 26 rises faster causing ferroelectric capacitor 21 to switch faster forcing more current into the control input of switch 23 increasing its conductivity. Thus, the circuit stabilizes with the potential of node 26 at a specific intermediate value with a slow rate of rise. In this manner, the change in conductivity of switch 23 limits the voltage rise at node 26 until the change in the state of ferroelectric capacitor 21 is completed. At this point, no further remanent charge will be released from ferroelectric capacitor 21, and hence, switch 23 will again become non-conducting and node 26 will rise to V. The potential during the transition of ferroelectric capacitor 21 will be referred to as the "shelf voltage", $V_s$, in the following discussion. The specific shape of the potential at node 26 will, in general, depend on the specific switch implementation.

Referring again to FIG. 1B, and in particular the dotted curve, the potential on the power rail and on node 26 shown in FIG. 1A is shown as a function of time when autonomous memory circuit 20 is powered up with ferroelectric capacitor 21 in the UP state. Since ferroelectric capacitor 21 does not switch on at power up, little current flows into the control input of switch 23 and switch 23 never conducts. The potential on node 26 immediately rises to the voltage on the power rail.

Figure 2:
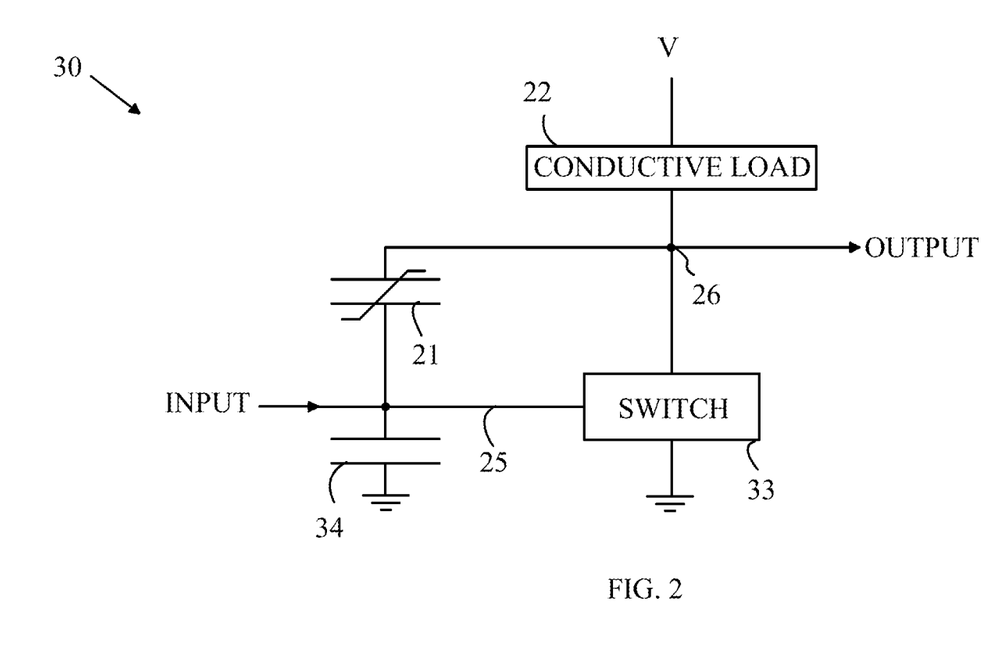
FIG. 2 is a schematic drawing of another embodiment of an autonomous memory circuit.

Refer now to FIG. 2, which is a schematic drawing of another embodiment of an autonomous memory circuit. Autonomous memory circuit 30 differs from autonomous memory circuit 20 in that switch 33 switches on a voltage signal rather than a current signal, and capacitor 34 has been added to provide a charge-to-voltage conversion. If ferroelectric capacitor 21 is in the UP state when power is applied, ferroelectric capacitor 21 will remain in the UP state and switch 33 will not become conductive because little charge is received by capacitor 34.

If ferroelectric capacitor 21 is in the DOWN state when power is applied, ferroelectric capacitor 21 will start to flip its polarization as power increases. The change in polarization gives rise to a charge that is released and stored on capacitor 34, thereby raising the potential at the input to switch 33. If capacitor 34 is correctly chosen, the increase in potential on current actuated control input 25 will be sufficient to cause switch 33 to conduct, thereby lowering the potential on node 26. Node 26 will remain at an intermediate potential between ground and V as long as ferroelectric capacitor 21 is changing state. Once ferroelectric capacitor 21 changes state completely, no additional charge will be stored on capacitor 34.

The charge on capacitor 34 will then leak off at a rate determined by the leakage current in switch 33. At this point, switch 33 will again become non-conducting, and node 26 will rise to V. Hence, autonomous memory circuit 30 behaves in a manner analogous to autonomous memory circuit 20 discussed above. That is, during power up, the output signal can be monitored to determine the state of ferroelectric capacitor 21 prior to power up. After power up has been completed, the output will be high and ferroelectric capacitor 21 will be in the UP state.

Figure 3:
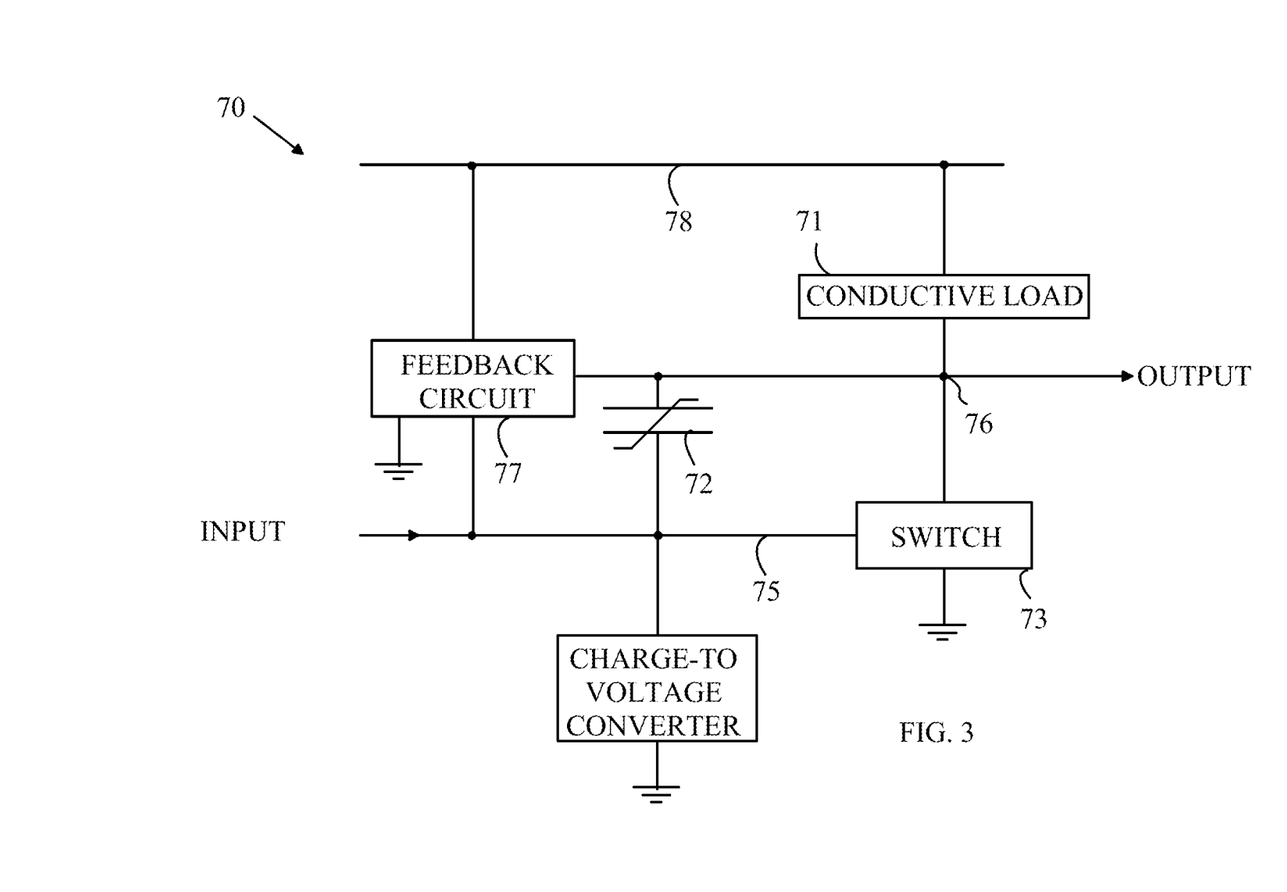
FIG. 3 is a block diagram of a non-volatile latch that utilizes a feedback path.

The autonomous memory circuit described above can be combined with a feedback path to construct a non-volatile latch. Refer now to FIG. 3, which is a block diagram of a non-volatile latch 70 that utilizes such a feedback path. Feedback circuit 77 in non-volatile latch 70 measures the difference in potential between node 76 and power rail 78 as the autonomous memory circuit powers up. If the potential difference across load 71 is greater than a predetermined threshold value, feedback circuit 77 generates a signal on line 75 that causes switch 73 to enter the conducting state, node 76 to go low, and ferroelectric capacitor 72 to be set to the DOWN state. With switch 73 on, the control input for feedback circuit 77 is held permanently on and the circuit latches. If the potential difference across load 71 is less than that predetermined threshold value, the feedback circuit remains off, switch 73 remains off, node 76 goes high, and ferroelectric capacitor 72 is set to the UP state.

Figure 4:
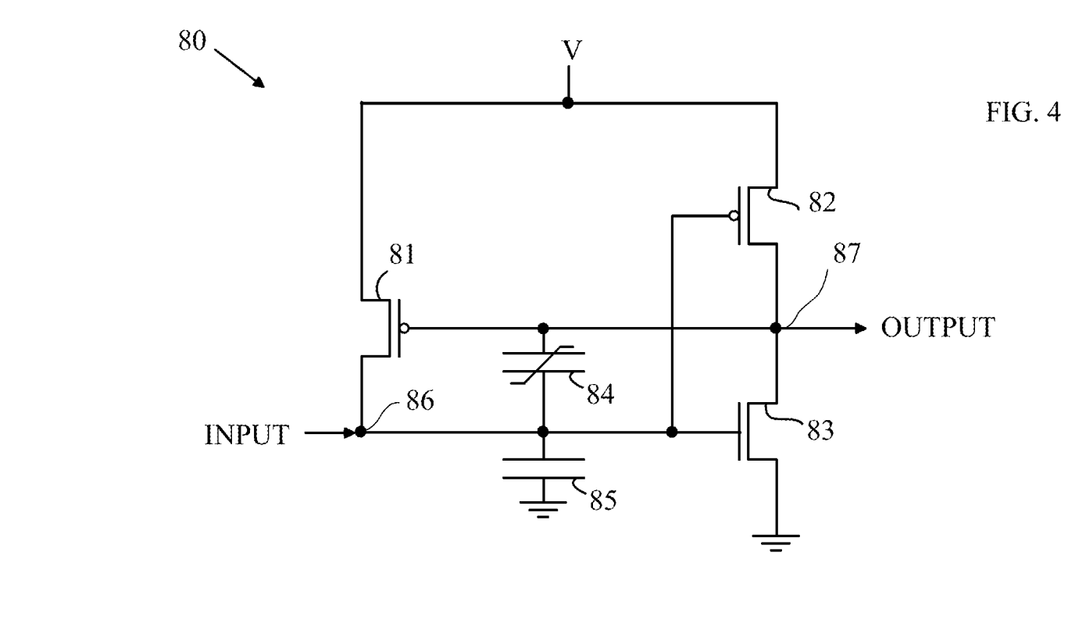
FIG. 4 is a schematic drawing of one embodiment of a non-volatile latch that utilizes field effect transistors (FETs).

Refer now to FIG. 4, which is a schematic drawing of one embodiment of a non-volatile latch 80 that utilizes FETs. Feedback transistor 82 acts as the conducting load in non-volatile latch 80. During power up, the potential on the gate of feedback transistor 81 will either be V or $V_s$, where $V_s$ is the reduced voltage that is present on node 87 during the time ferroelectric capacitor 84 is changing polarization states. If the potential is V, feedback transistor 81 stays totally off, and hence, feedback transistor 81 provides a high impedance. In this case, feedback transistor 81 never turns on and transistor 83 stays off. Output goes high and ferroelectric capacitor 84 remains programmed in the UP state.

If the $V_s$ is generated at node 87, feedback transistor 81 is subjected to a negative potential between the drain and gate that is sufficient to turn feedback transistor 81 on, and hence, feedback transistor 81 provides a very low impedance if the shelf voltage is generated at node 87. If feedback transistor 81 turns on, transistor 83 turns on, pulling node 86 to V and node 87 to ground, and hence, applying all of V to ferroelectric capacitor 84 to switch ferroelectric capacitor 84 back to the DOWN state. Non-volatile latch 80 can be programmed while non-volatile latch 80 is powered by pulling node 87 to ground to turn on feedback transistor 81 or pulling node 86 to ground to turn off feedback transistor 81.

The threshold criteria described above is met by designing the circuit so that the difference between the shelf voltage, $V_s$, and V is greater than the threshold voltage of feedback transistor 81. The charge-to-voltage conversion is provided by capacitor 85.

It should be noted that non-volatile latch 80 must be isolated by high impedance circuits. If the circuit that provides the input signal presents a low impedance to feedback transistor 81 when node 86 is high, node 86 can be dragged down to a low voltage, and hence, cause a change of state for the latch. Similarly if the circuit being driven by the output has a low impedance, node 87 can be dragged to a low voltage when the output of the latch at node 87 is supposed to be high.

It should also be noted that non-volatile latch 80 is an inverter. A low signal on the input leads to a high signal on the output, and a high signal on the input leads to a low signal on the output. Hence, if the latch is to be inserted in a logic line as described below, an inverter must be present on either the input or the output of the latch. This inverter can also buffer the input or output to provide the high impedance for the input or the output discussed above.

Figure 5:
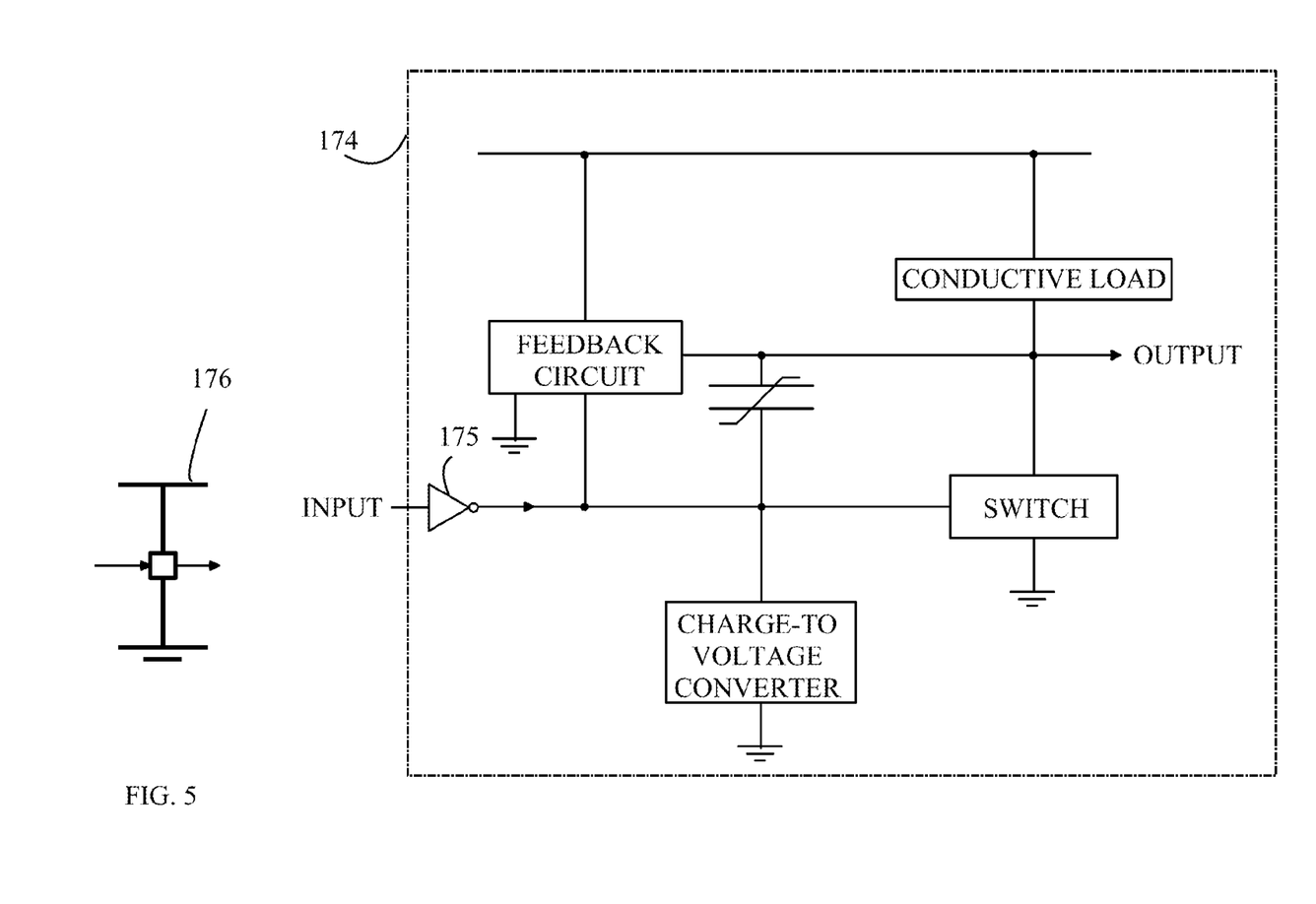
FIG. 5 illustrates an AML having an inverter buffer on the input.

To simplify the following discussion, it will be assumed that an inverter/buffer is included on the input of the AML; however, the inverter/buffer could also be on the output of the AML. Refer now to FIG. 5, which illustrates an AML 174 having an inverter/buffer 175 on the input. In the following discussion, such an AML in series with an inverter, either on the input or the output, will be denoted by the symbol shown at 176 unless the particular application requires that only one of these possibilities will function. In that case, the symbol denotes only the possible functioning alternative.

Figure 6A:
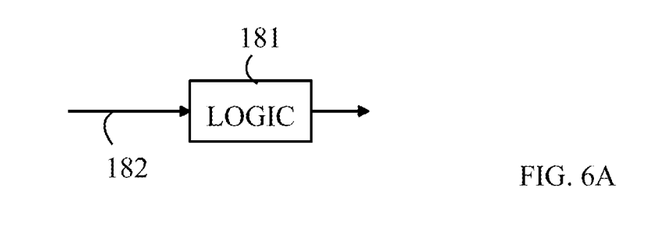
FIGS. 6A and 6B illustrate the insertion of an AML according to the present invention into a logic path.
Figure 6B:
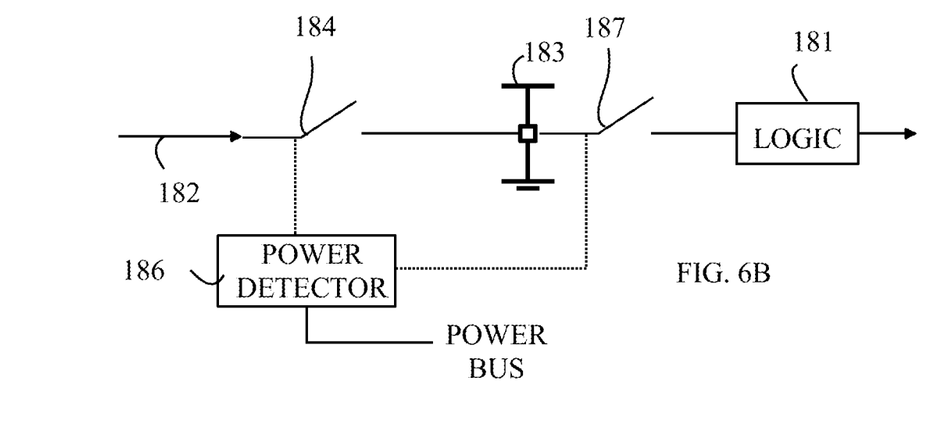

An AML according to the present invention can be embedded in logic such that the state of the logic can be preserved across power interruptions. Refer now to FIGS. 6A and 6B which illustrate the insertion of an AML according to the present invention into a logic path. Referring to FIG. 6A, assume that the device includes a logic circuit 181 that receives an input on line 182 and produces some output. If power is lost, the state of the system is lost because the logic level on line 182 is lost. Refer now to FIG. 6B. An AML 183 can be inserted into line 182 to capture the logic value on line 182. Since the AML does not alter the logic level on the line into which it is inserted, the presence of the AML does not alter the logic circuit since the output of the AML merely follows the input of the AML. However, when power is lost, the AML stores the state of line 182 prior to the power loss. Hence, when power is returned, the AML re-establishes the stored logic level to the input of logic circuit 181.

As noted above, the AML can be written and read at the same logic levels as utilized by logic circuit 181. Hence, the AML must be protected from transients on the input and output of AML 183 during power failures and the powering up of the circuit. This protection can be provided by a switch 184 that isolates AML 183 from line 182 when power is off or unstable, i.e., during power up and power down. The switch is operated by a power detection circuit 186 that closes the switch when power is on and stable and opens the switch in response to a determination that power is failing. The power protection circuit must store sufficient power to generate the open switch signal before power is completely lost. Switch 184 is preferably a normally open switch which is closed by the signal from power detection circuit 186.

In the example discussed with respect to FIGS. 6A and 6B, it is assumed that the input to logic circuit 181 has sufficiently high impedance and is free from transients during power up and power down. If transients are present on this line, a second isolation switch of the type shown at 184 must be inserted into line 182 between AML 183 and logic circuit 181 as shown at switch 187.

It should be noted that switch 187 could be part of logic circuit 181 provided switch 187 can be operated to provide the isolation of AML 183 without causing problems for logic circuit 181. For example, if the first stage of logic circuit 181 is a transparent latch, i.e., a cross-coupled buffer with a switch that enables input into the buffer to capture a value, the switch could provide the required isolation. Similarly, if the AML is driven by a latch with an output switch, e.g. a transparent latch with output enabled, the output switch of the latch could provide the required isolation provided by switch 184.

The arrangement shown in FIG. 6B will be referred to as "inline" logic. If the output of logic circuit 181 is routed back to a point in the circuitry that alters the logic level on line 182, a more complicated isolation arrangement is needed. A circuit in which the output is coupled back to the input in a manner that alters the input will be referred to as "circular" logic.

Figure 6C:
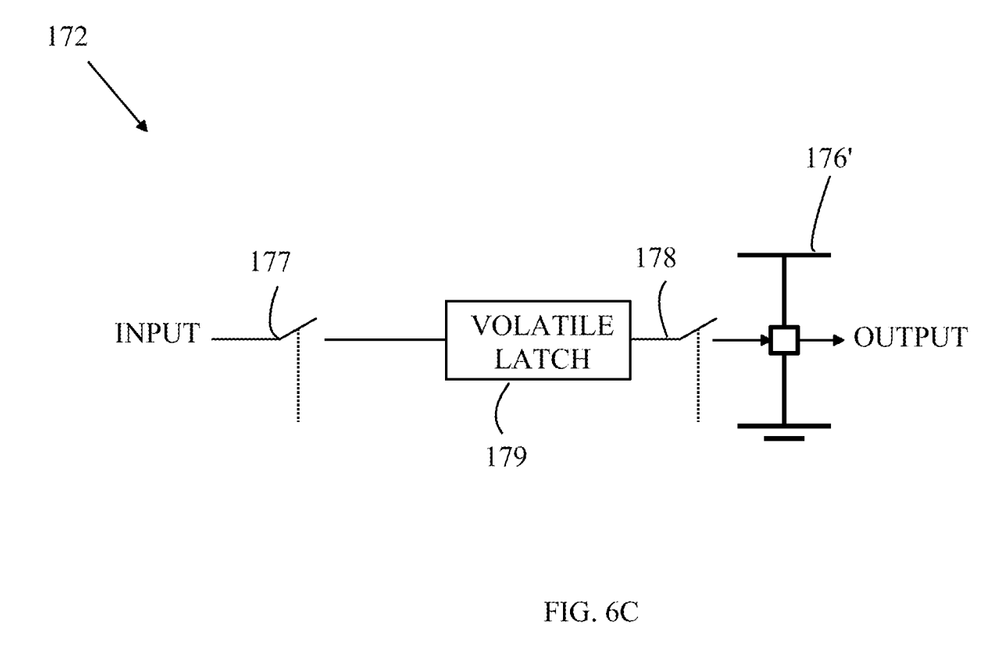
FIG. 6C illustrates a non-volatile master-slave flip-flop according to one embodiment of the present invention.

Some aspects of the present invention can be more easily understood with reference to a circuit that will be referred to as non-volatile master-slave flip-flop (NVFF). Refer now to FIG. 6C, which illustrates an NVFF according to one embodiment of the present invention. NVFF 172 includes a conventional volatile latch 179 that is connected to AML 176' by a first switch 178. The input to volatile latch 179 is connected to the NVFF input by a second switch 177. During power up and power down, switch 177 must be open to protect the contents of AML 176' from being altered by transients during the power up or power down operation.

NVFF 172 can be operated so that the input to NVFF 172 is never directly connected to the output of NVFF 172. During normal operation, there are two possible switching sequences having three steps. In the first sequence, switches 177 and 178 start with both switches open. Next, switch 177 is closed and then opened. Next, switch 178 is closed and then opened. In the second sequence, switch 177 is closed and switch 178 is open. Next, switch 177 is opened, followed by closing switch 178. Next switch 178 is opened followed by closing switch 177.

It should also be noted that the relative positions of volatile latch 179 and AML 176' can be reversed. That is, an NVFF consisting of switch 177 connected to AML 176' whose output is connected to switch 178 which is connected to volatile latch 179 will also function. Hence, an NVFF will be defined to be a circuit having an input and output and four components connected in series. The first component is a switch connected to the input. The second component is one of a latch or an AML, the second component being connected to the first switch. The third component is a second switch that connects the output of the first component to the fourth component. The fourth component is the other of the latch or AML. The output of the NVFF being the output of the fourth component.

Figure 7A:
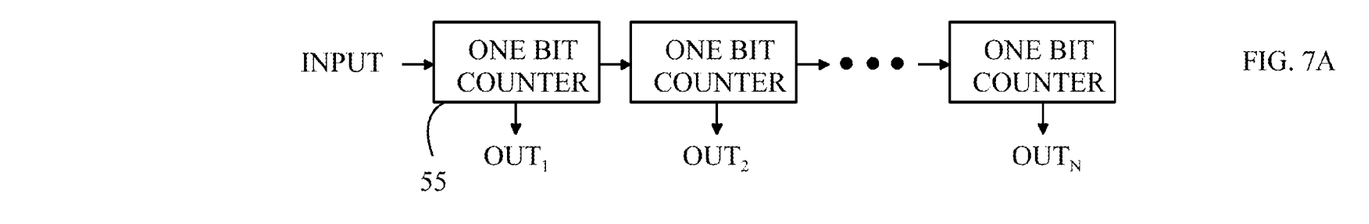
FIG. 7A illustrates a binary counter constructed from N single bit counters connected as a series chain.
Figure 7B:
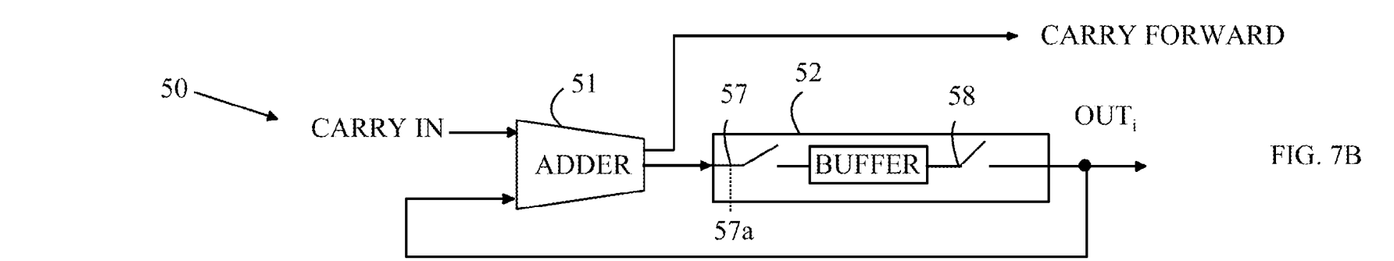
FIG. 7B illustrates a single bit counter that does not have an AML for preserving the state of the counter across power failures.
Figure 7C:
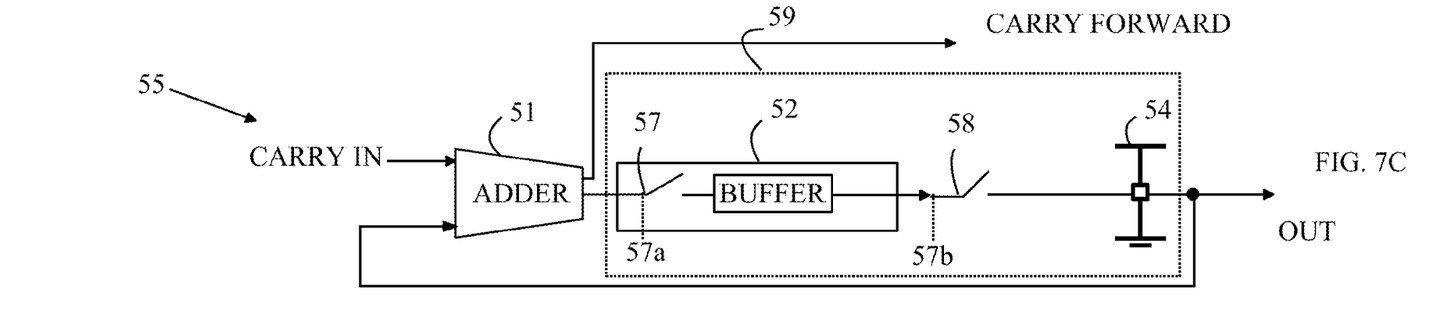
FIG. 7C illustrates an embodiment of a single bit counter that includes an AML that preserves the counter's state across power failures.

The manner in which an AML is used in a circular logic configuration will now be explained with reference to a simple binary counter circuit that is constructed from a plurality of single bit counter circuits. Refer now to FIGS. 7A-7C, which illustrate a binary counter constructed from a plurality of single bit counters and embodiments of single bit counters constructed with and without an AML. Referring to FIG. 7A, the binary counter is constructed from N single bit counters connected as a series chain. Single bit counter 55 is an exemplary counter. Each single bit counter receives an input signal and generates two output signals. The first output signal is a carry forward signal that provides the input to the next single bit counter in the chain. The second output is the binary count associated with that hit, shown at $OUT_1$, $OUT_2$, ... $OUT_N$.

Refer now to FIG. 7B, which illustrates a single bit counter 50 that does not have an AML for preserving the state of the counter across power failures. Single bit counter 50 includes an adder 51 and a transparent latch 52. Transparent latch 52 prevents a race condition in which the output of adder 51 would be directly fed back to the corresponding input of adder 51. Transparent latch 52 includes an input enable switch 57 and a cross-coupled buffer. Input enable switch 57 is controlled by a signal on control line 57*a*. The output of transparent latch 52 includes an output enable switch 58. To prevent a race condition, switches 57 and 58 must never be closed simultaneously. A device that includes switch 57, transparent latch 52, and switch 58 is called a transparent latch with output control.

Adder 51 adds the two bits input thereto to generate an output that is stored in transparent latch 52 and a carry forward signal. If both signals input to adder 51 are "0", adder 51 generates a "0" for both its output and carry forward. If one input is a "0" and the other is a "1", then adder 51 generates a "1" for its output and a "0" for its carry forward signal. Finally, if both inputs are a "1", adder 51 generates a "1" for its output and a "1" for its carry forward signal. If power is lost, the contents of the latches are lost.

Refer now to FIG. 7C, which illustrates an embodiment of a single bit counter 55 that includes an AML that preserves the counter's state across power failures. Single bit counter 55 differs from single bit counter 50 in that an additional switch 58 that is controlled by a signal on control line 57*h* has been introduced after transparent latch 52 as shown at switch 58, and an AML 54 has been placed in the output line. In general, circular logic must have two switches in the feedback path to prevent an analog closed loop from forming from the output of the autonomous memory back to its input. The circuit shown at 59 is an example of an NVFF discussed above. As noted above, the order of the conventional latch, i.e., cross-coupled buffer in transparent latch 52 and AML 54 could also be reversed, and the circuit would still function as intended.

In circular logic, the autonomous memory must be isolated from the other circuits in two ways at two different times. First, when recalling the data from the autonomous bit, the input of the AML must be disconnected from the outputs of the other circuitry so that spurious outputs by the circuitry as it processes its new inputs do not asynchronously overwrite the data in the latch. Second, when storing the data back into the AML after work has been performed on the data, there must be a circuit on the output of the other circuit to capture the result of that circuit but hold it isolated from the output of the circuit when the result is transferred to the input of the AML. This second requirement is needed because as soon as the result is loaded into the AML, the output of the circuit that produced the input to the latch may begin to change, and that change should be ignored.

In the embodiment shown in FIG. 7C, the input enable switch that is part of transparent latch 52 was used as one of the two switches required in circular logic. This embodiment depends on the fact that input enable switch 57 can be operated during the power up and down cycles without altering the operation of the circuit. In other embodiments, a separate switch could be introduced in the circular path to provide the required switch so that the switch can be operated independently of the switches that are part of the transparent latches in the circuitry.

Figure 7D:
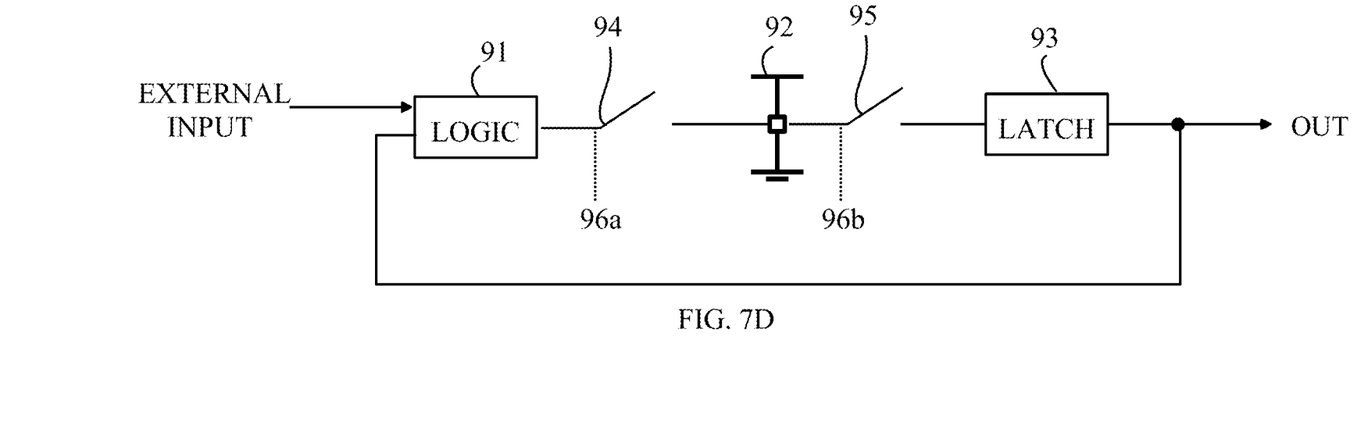
FIG. 7D illustrates a circular logic circuit in which an AML is located between a logic circuit and a volatile latch.

In the embodiment shown in FIG. 7C, the volatile latch is located between the logic element and the AML. However, embodiments in which the AML is located between the logic device and the AML can also be utilized. Refer now to FIG. 7D, which illustrates a circular logic circuit in which AML 92 is located between a logic circuit 91 and a volatile latch 93. Switches 94 and 95 are operated in a manner analogous to switches 57 and 58 shown in FIG. 7C. The manner in which control lines 96*a* and 96*b* are operated will be discussed in more detail below.

The clocked embodiments can be used to construct a class of devices that will be referred to as sequential logic devices. Sequential logic is defined to be a plurality of combinatorial logic blocks separated by NVFFs. A combinatorial logic block is defined to be a logic block having one or more inputs and one or more outputs, the combinatorial logic block processing the inputs to generate the outputs. The combinatorial logic block does not include any memory elements that store previous results and whose stored values are used in computing the current output.

Figure 8:
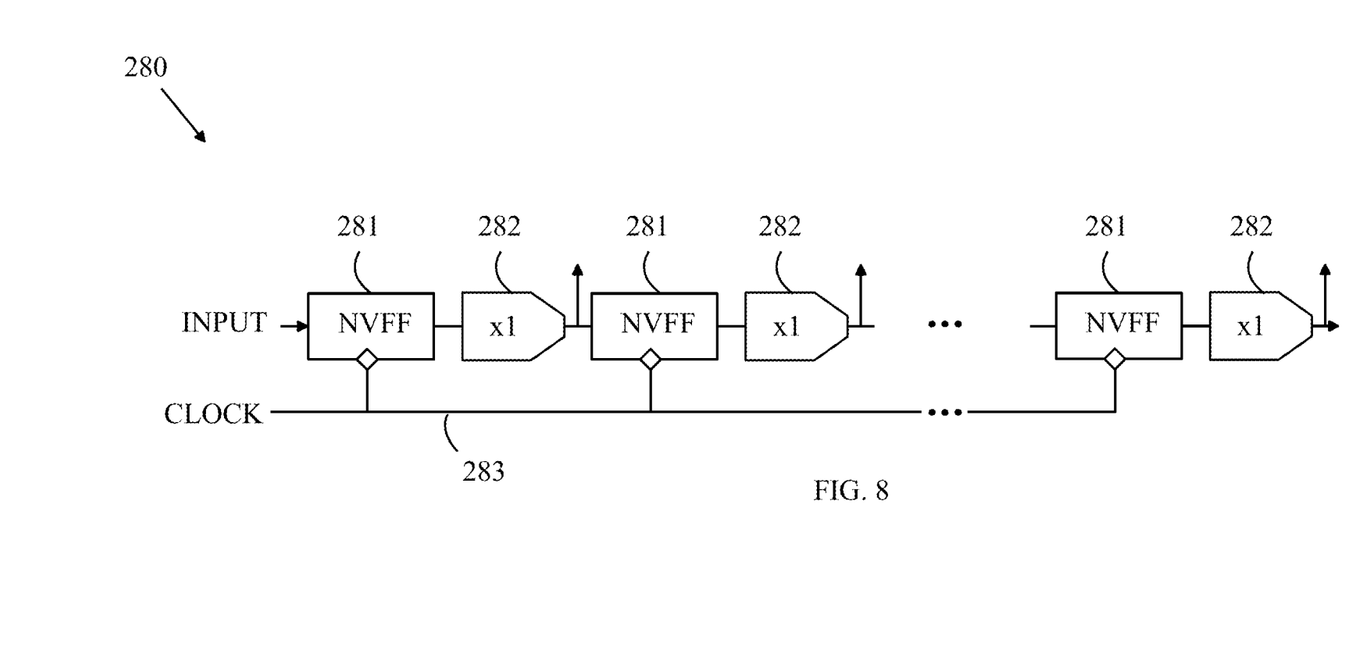
FIG. 8 illustrates an embodiment of a shift register according to the present invention.

A shift register can be viewed as a sequential logic circuit having a plurality of stages in which the combinatorial logic blocks are blocks that just copy the input to the combinatorial logic block to the output of the combinatorial logic block, i.e., multiply the input by "1". Refer now to FIG. 8, which illustrates an embodiment of a shift register according to the present invention. Shift register 280 is constructed from a plurality of clocked NVFFs 281 that are connected in series with a multiply by one combinatorial logic block 282. The shift registers are clocked on line 283. Shift register 280 can be used to convert a serial data stream into a parallel data stream by tapping the outputs of each of the combinatorial logic blocks. Shift register 280 can also be used as a delay circuit. During a period of power interruption, shift register 280 retains the bits stored therein prior to the power interruption.

In the more general case, the combinatorial logic blocks shown at combinatorial logic block 282 would be replaced by combinatorial logic blocks having different functions. The combinatorial logic blocks within a given device do not need to be the same. Furthermore, the combinatorial logic blocks can have additional inputs and outputs depending on the particular circuit. For example, the combinatorial logic blocks in the counter shown in FIG. 7C are adders.

It should be noted that circular logic that includes an AML must always have a latch and two switches in the feedback path to ensure that the feedback path from the AML output to its input is always interrupted. In some cases, the latch may be part of the existing circuitry as was the case with the counter discussed above with respect to FIGS. 7A-7C. The switches are operated as discussed above with reference to FIG. 6C.

It should be noted that inline uses of AMLs only require a single switch to isolate the input to the AML during changes in the state of the power system or periods in which the level of the input to the AML is not to be copied into the AML. This assumes, however, that the output of the AML is connected to a high impedance and that no voltage spikes propagate in the reverse direction during a power failure.

Figure 9:
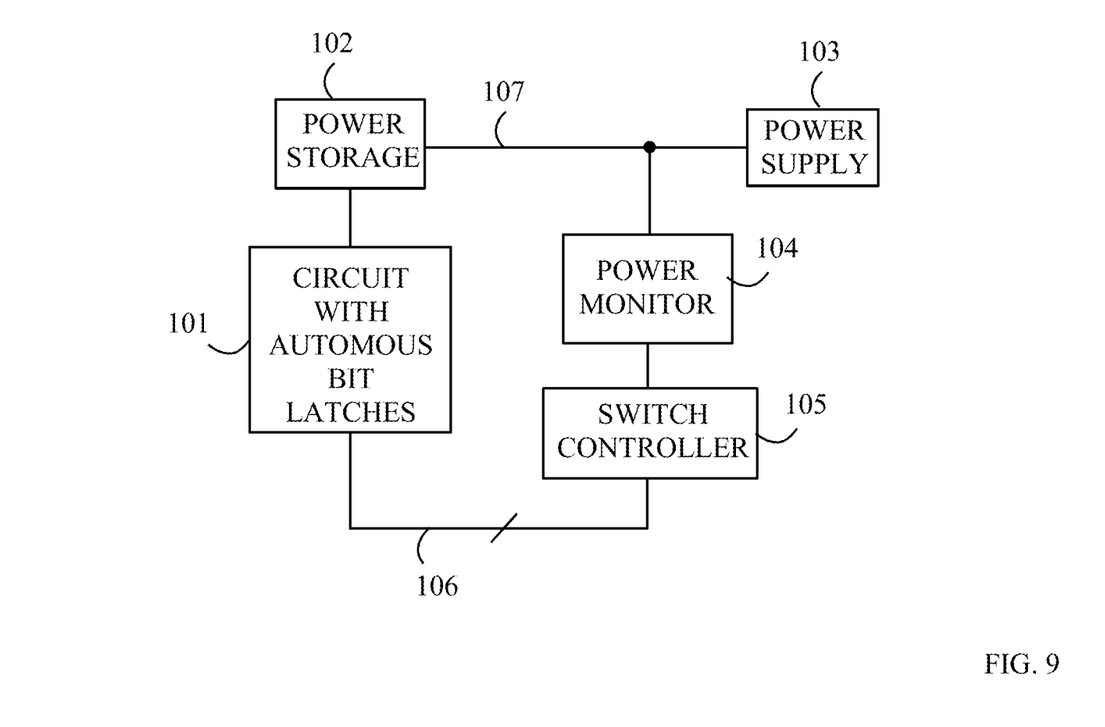
FIG. 9 illustrates the manner in which power is managed in a circuit that includes one or more AMLs.

Refer now to FIG. 9, which illustrates the manner in which power is managed in a circuit that includes one or more AMLs. The power supply 103 that powers the circuit 101 that includes the AMLs must store sufficient power to carry the system for the length of time needed to open the various switches that protect the AMLs after a power failure is detected. Circuit 101 is powered by providing a potential between first and second terminals on circuit 101. The power needed during the shutdown is stored in power storage component 102 which maintains the potential between the first and second terminals. The amount of power that must be stored is that which is needed to power circuit 101 for the length of time needed to open the various protection switches that are embedded in circuit 101. In one aspect of the invention, power storage component 102 includes a capacitor that stores the required energy. The amount of energy needed depends on the time needed to open the various protection switches, but, in general, will be less than the power needed to operate circuit 101 for a few microseconds.

In one aspect of the invention, the power on power bus 107 is monitored by a power monitor 104. When power monitor 104 detects a loss of power from power supply 103 by observing a potential on power bus 107 that decreases to a value less than a predetermined value, power monitor 104 signals switch controller 105 which controls the state of the various protection switches in circuit 101 via bus 106.

The manner in which circuit 101 is powered up is somewhat more complicated and, in general, will depend on the details of circuit 101. The power up sequence ensures that circuit 101 resume operation in a state that existed prior to power monitor 104 detecting the power failure. Refer again to FIG. 7D. As noted above, on power up, switches 94 and 95 are open. After sufficient time for AML 92 to stabilize its output, switch 95 is closed but switch 94 remains open. After a time period that is sufficient for the results of volatile latch 93 being connected to logic circuit 91 to have stabilized, switch 94 is closed, and circuit operation can commence. If logic circuit 91 also includes an AML, additional timing delays may be required to ensure that the additional AMLs have time to stabilize before being connected back into the circuit. For any given circuit design, a power up program for the AMLs can be designed to ensure that the AMLs are not disturbed by transients during the power up process.

Figure 10:
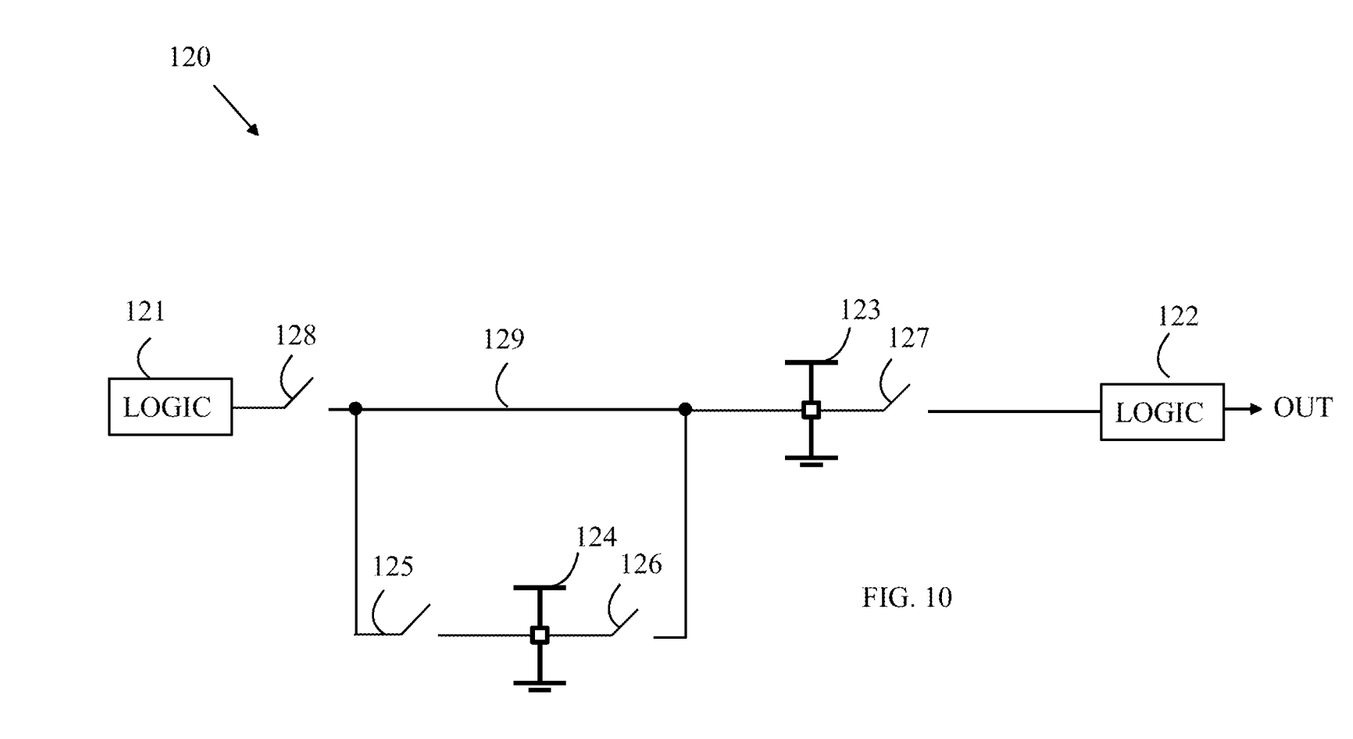
FIG. 10 illustrates a circuit in which an AML is used to store the state of a node during the operation of a circuit and then used to restore that state at some later time.

In the above-described embodiments, the AMLs are utilized to store a state of a circuit across a power interruption by inserting the AMLs in the circuit paths in a manner in which the AMLs are invisible to the operation of the circuit during normally powered operation. However, embodiments in which the AMLs are used to store other states during the operation of a circuit can also be constructed. For example, an AML can be utilized to store a state of the circuit during normal operation that is to be recalled later after the state of the circuit has changed due to the operation of the circuit. Refer now to FIG. 10, which illustrates a circuit in which an AML is used to store the state of a node during the operation of a circuit and then used to restore that state at some later time. Circuit 120 includes two logic circuits 121 and 122 that are connected through a first AML 123 whose input is derived from node 129. AML 123 and switches 127 and 128 operate in an inline configuration to preserve the state of node 129 in a manner analogous to that described above. In normal operation, switches 128 and 127 are closed. At some point in the operation of circuit 120, the state of node 129 is read into a second AML 124 by closing switch 125. At some subsequent time, the contents of AML 124 are used to re-establish the state of node 129 by opening switches 128 and 125 and closing switch 126. The choice of times to store and recover the level on node 129 depends on the overall circuit in which circuit 120 is located. It should be noted that the value stored in AML 124 could also be a "reset" value that is permanently stored in AML 124 and used to reset node 129. In this case, switch 125 would be absent. In one embodiment, the input to AML 124 comes from an external bus to allow external programming of the stored state that will be present at start-up.

It should be noted that circular logic includes an AML with an input switch in series with a latch with an input enable switch. To simplify the discussion, define an AML with an input switch as a transparent AML. A latch with an input enable switch is normally referred to as a transparent latch. Hence, the simplest circular logic circuit consists of a circuit element having an input and an output that is placed in series with an AML circuit that includes a transparent AML and a transparent latch connected in series. FIG. 7D illustrates the case in which the transparent AML is connected between the circuit element, i.e., logic circuit 91, and the transparent latch consisting of switch 95 and volatile latch 93. FIG. 7C illustrates the case in which the transparent latch is between the circuit element, i.e., adder 51, and the transparent AML consisting of switch 58 and AML 54. In either case, the AML circuit has an input that is connected to the circuit element output and an AML circuit output that is connected to the input of the circuit element.

In more complex arrangements, there may be other circuit elements between the transparent AML and the transparent latch. Similarly, there may be other circuit elements between the output of the AML circuit and the input of the circuit element. In the later case, the other circuit elements can be considered to be part of the circuit element. To simplify the following discussion, the case in which there are additional elements between the AML and the latch will also be referred to as a circuit in which the AML and latch are connected in series.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A method for operating a circuit comprising a circuit element input and a circuit element output and an AML circuit comprising a transparent latch and a transparent AML connected in series, said AML circuit having an AML circuit input connected to said circuit element output and an AML circuit output connected to said circuit element input, said method comprising:

isolating said AML input from said circuit element output;

connecting said AML output to said latch for a first period of time after said AML has recalled a value stored therein;

disconnecting said AML output from said latch;

connecting said circuit element output to said AML input; and disconnecting AML input from the circuit element output.

2. The method of claim 1 wherein said transparent AML input is connected to said circuit element output.

3. The method of claim 1 wherein said transparent latch input is connected to said circuit element output.

4. The method of claim 1 wherein said circuit is powered from a power supply, said method further comprising:

detecting a power interruption; and isolating said AML from said circuit element and said latch during periods of time in response to said power interruption.

5. The method of claim 4 wherein said AML remains isolated from said circuit element and said latch while power is interrupted.

6. The method of claim 1 wherein said first period of time is greater than a time needed for said circuit to stabilize after said circuit is powered up.

* * * * *